(12) United States Patent
Kashiwazaki

(10) Patent No.: US 6,570,815 B2
(45) Date of Patent: May 27, 2003

(54) SEMICONDUCTOR MEMORY DEVICE CAPABLE OF ADJUSTING PHASE OF OUTPUT DATA AND MEMORY SYSTEM USING THE SAME

(75) Inventor: Yasuhiro Kashiwazaki, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/973,886

(22) Filed: Oct. 11, 2001

(65) Prior Publication Data
US 2002/0159325 A1 Oct. 31, 2002

(30) Foreign Application Priority Data
Apr. 25, 2001 (JP) ........................................ 2001-127781

(51) Int. Cl.[7] ................................................ G11C 8/00
(52) U.S. Cl. ........................................ 365/233; 365/194
(58) Field of Search ................................. 365/194, 233

(56) References Cited

U.S. PATENT DOCUMENTS
6,229,363 B1 * 5/2001 Eto et al. ..................... 327/158

FOREIGN PATENT DOCUMENTS
JP         10-374176       12/1998
JP         2000-194594      7/2000

* cited by examiner

Primary Examiner—M. Tran
(74) Attorney, Agent, or Firm—McDermott, Will & Emery

(57) ABSTRACT

In a DLL circuit of a DDR SDRAM, in addition to a replica buffer for compensating delay in an output buffer, a replica buffer for compensating flight time is provided. The phase of a clock signal CLKP outputted to the outside so as to be locked with a clock signal BUFFCLK can be adjusted in accordance with a control signal b[1:0]. For a controller receiving data in a lump from a plurality of semiconductor memory devices, the arriving timings of data from the semiconductor memory devices can be aligned. Therefore, it is unnecessary to capture data in response to a data strobe signal DQS, so that burden on the controller is lessened.

20 Claims, 15 Drawing Sheets

SEMICONDUCTOR MEMORY DEVICE CAPABLE OF ADJUSTING PHASE OF OUTPUT DATA AND MEMORY SYSTEM USING THE SAME

BACKGROUND OF THE INVENTION

1. Field of the Invention

The present invention relates to a semiconductor memory device and a system on which the semiconductor memory device is mounted. More particularly, the invention relates to a semiconductor memory device for outputting data synchronously with a clock signal and a system on which the semiconductor memory device is mounted.

2. Description of the Background Art

In recent years, in order to transfer/receive data at high speed, a double data rate synchronous dynamic random access memory (DDR SDRAM) capable of outputting data synchronously with both rising and falling edges of a clock signal is used.

On a system using this memory, in many cases, a plurality of DDR SDRAMs and a controller for transmitting/receiving data to/from the DDR SDRAMs are mounted.

In such a memory system, external clock signals of the same phase are input to the controller and the DDR SDRAMs. The DDR SDRAM is designed so that a data output signal DQ is switched at the phase of the rising edge and that of the falling edge of an external clock signal supplied.

FIG. 14 is a block diagram showing the configuration of a conventional DDR SDRAM 501.

Referring to FIG. 14, DDR SDRAM 501 includes an address buffer 504 for receiving external address signals A0 to A11 and bank address signals BA0 and BA1 and generating internal address signals INTA0 to INTA11; a clock signal buffer 502 for receiving external clock signals CLK and /CLK and a clock enable signal CKE and generating an internal clock signal ICLK; a control signal buffer 506 for receiving a chip select signal /CS, a row address strobe signal /RAS, a column address strobe signal /CAS, a write enable signal /WE, and input/output DQ mask signals UDM and LDM synchronously with internal clock signal ICLK; a control circuit 508 for receiving internal clock signal ICLK, internal address signals INTA0 to INTA11 and an output of control signal buffer 506 and controlling the whole chip; and a mode register 510 for holding an operation mode of the SDRAM according to an output of the control signal buffer in response to an instruction of control circuit 508.

DDR SDRAM 501 further includes: a DQ buffer 514 for transmitting/receiving a data signal to/from an external data bus; and memory arrays 512a to 512d for holding data input from the outside. Memory arrays 512a to 512d are four banks which can operate independent of each other.

DDR SDRAM 501 further includes: a DLL (Delay Locked Loop) circuit 516 for receiving internal clock signal ICLK as a clock signal BUFFCLK from clock signal buffer 502 and outputting a clock signal CLKP to DQ buffer 514; and a QFC and QS buffer 518 for outputting control signals /QFC, UDQS, and LDQS in accordance with control timings of DQ buffer 514.

Control signal /QFC can be used as a control signal for isolating the external bus from other devices when a read or write access is made to DDR SDRAM. Control signals UDQS and LDQS are strobe signals used by a controller to capture a data signal outputted to the external data bus.

FIG. 15 is a diagram for explaining the configuration of mode register 510 and control circuit 508 in FIG. 14.

Referring to FIG. 15, the control circuit 508 includes a command decoder 622 for receiving and decoding an output of control signal buffer 506 to detect a command and, when a mode register set command is detected, activating a control signal /MSET to the L level; an inverter 624 for receiving and inverting control signal /MSET and outputting a control signal MSET; and clocked inverters 650 to 652 which are made active in association with activation of the control signal MSET, and receive and invert internal address signals INTA0 to INTA2, respectively, from address buffer 504.

For simplicity of explanation, the configuration of control circuit 508 only with respect to the portion of writing data to mode register 510 is shown.

Mode register 510 includes latch circuits 630 to 632 for receiving outputs of clocked inverters 650 to 652, respectively, and inverters 640 to 642 for receiving and inverting outputs of latch circuits 630 to 632 and outputting signals K0 to K2, respectively.

Latch circuit 630 includes an inverter 662 for receiving and inverting an output of clocked inverter 650, and an inverter 660 for receiving and inverting an output of inverter 662 and feeding back the resultant to the input of inverter 662. Since the configuration of each of latch circuits 631 and 632 is similar to that of latch circuit 630, its description will not be repeated.

FIG. 16 is a circuit diagram showing the configuration of DLL circuit 516 in FIG. 14.

Referring to FIG. 16, DLL circuit 516 includes: a delay line 32 for delaying clock signal BUFFCLK and outputting a clock signal CLKP; a replica buffer 34 for receiving clock signal CLKP, compensating delay time of DQ buffer 514 in FIG. 14 as an output buffer, and outputting a clock signal FBCLK; and a phase comparator 38 for comparing the phase of clock signal BUFFCLK and that of clock signal FBCLK and outputting control signals a[0] to a[2].

Delay line 32 receives clock signal BUFFCLK by its node N1. Delay line 32 includes: an N-channel MOS transistor 44 connected between nodes N1 and N2 and for receiving control signal a[0] by its gate; a delay circuit 56 whose input is connected to node N2 and whose output is connected to a node N3; and a P-channel MOS transistor 46 connected between nodes N1 and N3 and for receiving control signal a[0] by its gate.

Delay line 32 further includes: an N-channel MOS transistor 48 connected between nodes N3 and N4 and for receiving control signal a[1] by its gate; a delay circuit 58 whose input is connected to node N4 and whose output is connected to a node N5; and a P-channel MOS transistor 50 connected between nodes N3 and N5 and for receiving control signal a[1] by its gate.

Delay line 32 further includes: an N-channel MOS transistor 52 connected between nodes N5 and N6 and for receiving control signal a[2] by its gate; a delay circuit 60 whose input is connected to node N6 and whose output is connected to a node N7; and a P-channel MOS transistor 54 connected between nodes N5 and N7 and for receiving control signal a[2] by its gate.

Delay circuit 56 includes two inverters connected in series. Delay circuit 58 includes four inverters connected in series. Delay circuit 60 includes eight inverters connected in series.

Replica buffer 34 includes inverters connected in series having delay time corresponding to delay time of DQ buffer 514.

FIGS. 17 and 18 are operational waveform charts for explaining the operation of DLL circuit 516 shown in FIG. 16.

First, by referring to FIGS. 16 and 17, clock signal BUFFCLK goes high at time t1 and, in response to this, clock signal CLKP goes high at time t2 after the delay time of delay line 32.

At time t3 after the delay time of replica buffer 34 for compensating a delay in an output buffer since time t2, clock signal FBCLK goes high.

Phase comparator 38 compares the rising edge of clock signal FBCLK at time t3 and that of clock signal BUFFCLK at time t4, and determines that the phase of clock signal FBCLK is advanced as compared with that of clock signal BUFFCLK.

Phase comparator 38 changes a control signal A[2:0] to increase delay time of delay line 32.

Referring now to FIGS. 16 and 18, after the delay time of delay line 32 is increased, delay time during a period from rising time t1 of clock signal BUFFCLK to rising time t2 of clock signal CLKP increases. At time t3, the phase at the rising edge of clock signal BUFFCLK and that at the rising edge of clock signal FBCLK coincides with each other.

As described above, the conventional DDR SDRAM is designed so that the data DQ is switched in the terminal portion with the same phase as that of external clock signal CLK supplied to the chip.

In the system using the DDR SDRAM, usually, a plurality of DDR SDRAMs are mounted on a board and reading/writing operations are performed on the DDR SDRAMs in a lump.

FIG. 19 is a diagram showing a schematic configuration of a system using the conventional DDR SDRAM.

Referring to FIG. 19, the conventional memory system includes: a clock generator 534 for supplying clock signal CLK to the system; DDR SDRAMs 501a and 501b for outputting data DQA and DQB to data buses connected to the outside; and a controller 532 for receiving clock signal CLK as an operation clock and capturing data DQA and DQB.

An example of such a memory system is a mother board on which a microprocessor using a DDR SDRAM as an external storage is mounted.

FIG. 20 is an operational waveform chart for explaining data transmission/reception of the memory system shown in FIG. 19.

Referring to FIGS. 19 and 20, each of DDR SDRAMs is controlled so that data signal DQ and strobe signal DQS change synchronously with the rising and falling edges of the clock signal CLK.

In each of DDR SDRAMs 501a and 501b, data signal DQ and strobe signal DQS are outputted from the terminal portion simultaneously with the rising edge of clock signal CLK at time t1.

However, data signal DQA outputted at time t1 from DDR SDRAM 501a arrives at controller 532 at time t2.

On the other hand, data signal DQB outputted at time t1 from DDR SDRAM 501b arrives at controller 532 at time t3. When data is captured synchronously with clock signal CLK supplied to the controller, a margin of data is decreased.

Consequently, each DDR SDRAM outputs data strobe signal DQS having the same phase as that of external clock signal on the chip at the time of data output. Controller 532 captures data signal DQA in response to strobe signal DQSA outputted from DDR SDRAM 501a, and captures data signal DQB in response to strobe signal DQSB outputted from SDRAM 501b.

Even when flight time of DDR SDRAMs is different from each other, by capturing data in response to strobe signal, controller 532 can receive data at high speed.

There is, however, a drawback such that since strobe signal DQS and data signal DQ are transmitted to controller 532 with phases various according to the DDR SDRAMs, signals of various phases have to be processed in controller 532, so that the burden on the controller 532 is heavy. It causes a problem such that the configuration of controller 532 is complicated.

Although the system on which DDR SDRAMs are mounted has been described above as an example, it can be said that all of systems in which output data is input from memories to controller with phases varying according to the memories have similar drawbacks.

SUMMARY OF THE INVENTION

An object of the invention is to provide a semiconductor memory device capable of adjusting arriving time of data in a system using a plurality of semiconductor memory devices and further to provide a memory system and a memory module each capable of transferring data at high speed with a simple configuration.

The invention relates to, in short, a semiconductor memory device for outputting data synchronously with an external clock signal supplied from the outside, which has an internal clock generating circuit, a memory array, and an output buffer circuit.

The internal clock generating circuit outputs a first internal clock signal synchronously with the external clock signal. The internal clock generating circuit adjusts a phase difference between the external clock signal and the first internal clock signal in accordance with a set value supplied from the outside. The memory array includes a plurality of memory cells for holding the data. The output buffer circuit outputs data read from the memory array synchronously with the first internal clock signal.

According to another aspect of the invention, a memory system including a clock generating circuit, a controller, and a plurality of semiconductor memory devices is provided.

The clock generating circuit generates a system clock signal. The controller receives a data signal synchronously with the system clock signal. The plurality of semiconductor memory devices output the data signal to the controller synchronously with the system clock signal.

Each of the semiconductor memory devices includes an internal clock generating circuit for outputting a first internal clock signal synchronously with the system clock signal. The internal clock generating circuit adjusts a phase difference between the system clock signal and the first internal clock signal in accordance with a set value supplied.

Each of the plurality of semiconductor memory devices further includes a memory array including a plurality of memory cells for holding the data and an output buffer circuit for outputting, as the data signal, the data read from the memory array synchronously with the first internal clock signal.

According to further another aspect of the invention, a memory module having a plurality of semiconductor memory devices for outputting a data signal synchronously with a system clock signal is provided.

Each of the plurality of semiconductor memory devices includes an internal clock generating circuit for outputting a first internal clock signal synchronously with the system clock signal. The internal clock generating circuit adjusts a phase difference between the system clock signal and the first internal clock signal in accordance with a set value supplied.

Each of the plurality of semiconductor memory devices further includes: a memory array including a plurality of memory cells for holding data; and an output buffer circuit for outputting, as the data signal, the data read from the memory array synchronously with the first internal clock signal.

Therefore, a main advantage of the invention is that, since the phase of the data output signal which is output synchronously with the clock signal can be changed according to the set value supplied, by adjusting the phases of data outputs in the memory system, burden on the controller can be lessened.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
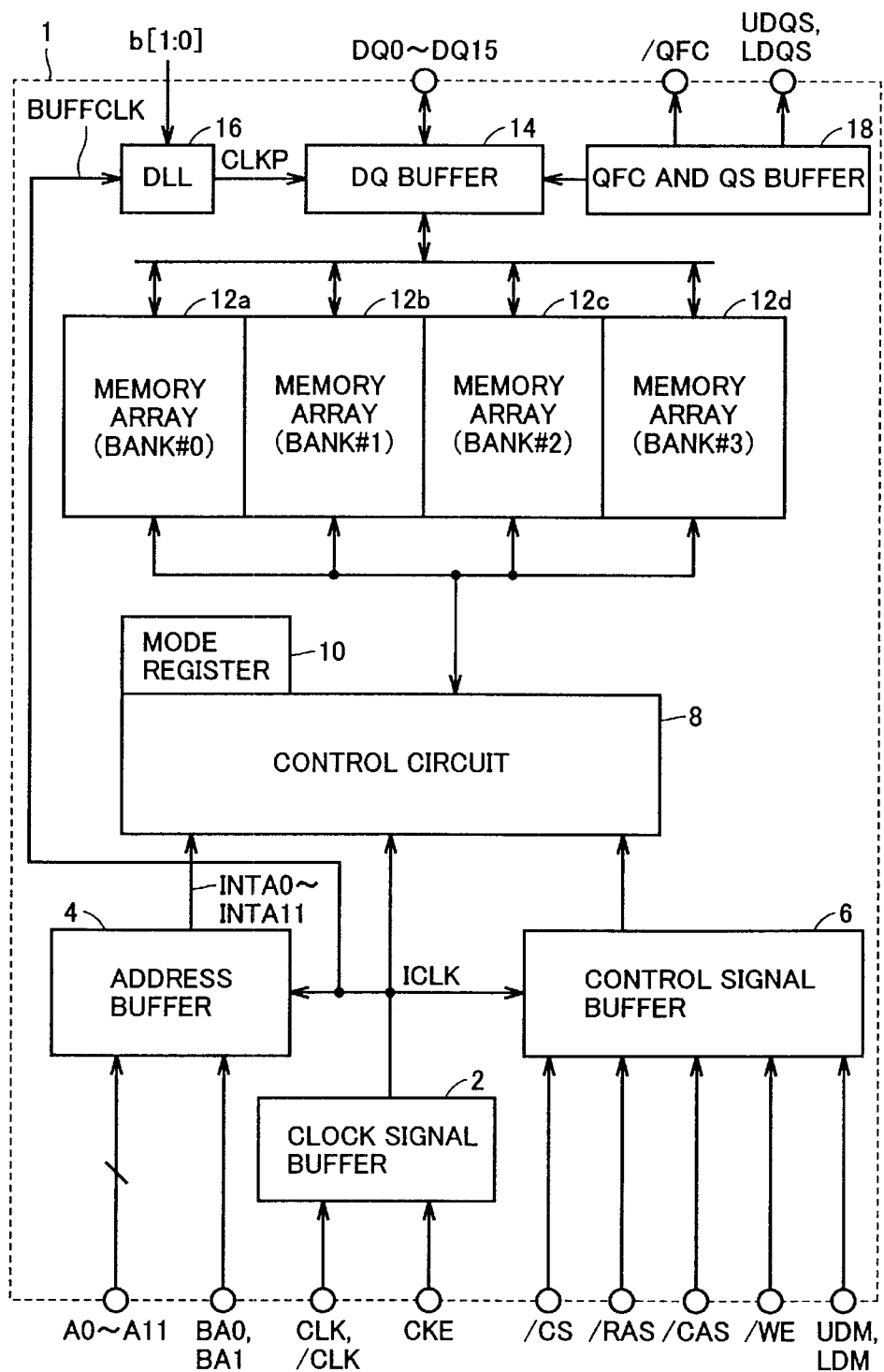
FIG. 1 is a schematic block diagram showing the configuration of a semiconductor memory device 1 of the invention.

Embodiments of the invention will be described in detail hereinbelow with reference to the drawings. The same reference numerals in the diagrams denote the same or corresponding components.
First Embodiment FIG. 1 is a schematic block diagram showing the configuration of a semiconductor memory device 1 of the invention.

Referring to FIG. 1, semiconductor memory device 1 includes: an address buffer 4 for receiving external address signals A0 to A11 and bank address signals BA0 and BA1 and generating internal address signals INTA0 to INTA11; a clock signal buffer 2 for receiving external clock signals CLK and /CLK and a clock enable signal CKE and generating an internal clock signal ICLK; and a control signal buffer 6 for receiving a chip select signal /CS, a row address strobe signal /RAS, a column address strobe signal /CAS, a write enable signal /WE, and input/output DQ mask signals UDM and LDM synchronously with the internal clock signal ICLK.

Semiconductor memory device 1 further includes: a control circuit 8 for receiving internal clock signal ICLK, internal address signals INTA0 to INTA11 and an output of the control signal buffer 6; and a mode register 10 for holding an operation mode of the SDRAM according to an output of the control signal buffer in response to an instruction of the control circuit 8.

Semiconductor memory device 1 further includes a DQ buffer 14 for transmitting/receiving a data signal to/from an external data bus and memory arrays 12a to 12d for holding data input from the outside. The memory arrays 12a to 12d are four banks which can operate independent of each other.

Semiconductor memory device 1 further includes: a DLL (Delay Locked Loop) circuit 16 for receiving internal clock signal ICLK as a clock signal BUFFCLK from clock signal buffer 2, delaying it in accordance with a control signal b[1:0], and outputting a clock signal CLKP to DQ buffer 14; and a QFC and QS buffer 18 for outputting control signals /QFC, UDQS, and LDQS in accordance with control timings of DQ buffer 14.

Control signal /QFC can be used as a control signal for isolating the external bus from other devices when a read or write access is made to DDR SDRAM. Control signals UDQS and LDQS are strobe signals used by the controller to capture a data signal outputted to the external data bus.

Figure 2:
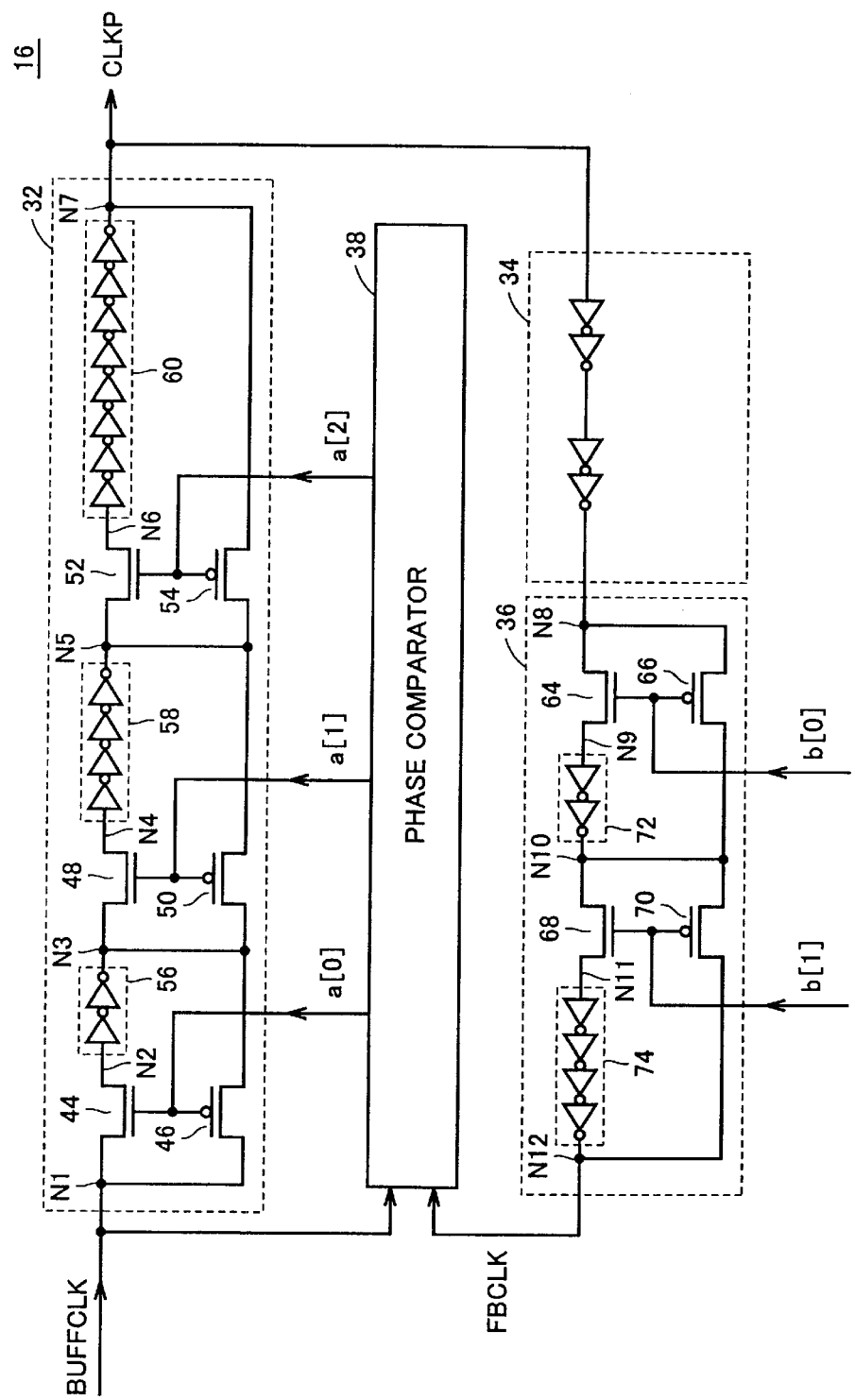
FIG. 2 is a circuit diagram showing the configuration of a DLL circuit 16 in FIG. 1.

FIG. 2 is a circuit diagram showing the configuration of DLL circuit 16 in FIG. 1.

Referring to FIG. 2, the DLL circuit 16 includes: delay line 32 for delaying clock signal BUFFCLK and outputting a clock signal CLKP; replica buffer 34 for receiving clock signal CLKP and compensating delay time of DQ buffer 14 in FIG. 1 as an output buffer; a replica buffer 36 for delaying an output of replica buffer 34 in accordance with the control signal b[1:0] and outputting clock signal FBCLK; and phase comparator 38 for comparing the phase of clock signal BUFFCLK and that of clock signal FBCLK and outputting control signals a[0] to a[2].

Delay line 32 receives clock signal BUFFCLK at its node N1. Delay line 32 includes: N-channel MOS transistor 44 connected between nodes N1 and N2 and for receiving control signal a[0] by its gate; delay circuit 56 whose input is connected to node N2 and whose output is connected to a node N3; and P-channel MOS transistor 46 connected between nodes N1 and N3 and for receiving control signal a[0] by its gate.

Delay line 32 further includes: N-channel MOS transistor 48 connected between nodes N3 and N4 and for receiving control signal a[1] by its gate; delay circuit 58 whose input is connected to node N4 and whose output is connected to node N5; and P-channel MOS transistor 50 connected between nodes N3 and N5 and for receiving control signal a[1] by its gate.

Delay line 32 further includes: N-channel MOS transistor 52 connected between nodes N5 and N6 and for receiving control signal a[2] by its gate; delay circuit 60 whose input is connected to node N6 and whose output is connected to node N7; and P-channel MOS transistor 54 connected between nodes N5 and N7 and for receiving control signal a[2] by its gate.

Delay circuit 56 includes two inverters connected in series. Delay circuit 58 includes four inverters connected in series. Delay circuit 60 includes eight inverters connected in series.

Replica buffer 34 includes inverters connected in series having delay time corresponding to delay time of DQ buffer 14.

Replica buffer 36 receives an output of replica buffer 34 by its node N8. Replica buffer 36 outputs clock signal FBCLK from its node N12.

Replica buffer 36 includes: an N-channel MOS transistor 64 connected between nodes N8 and N9 and receiving control signal b[0] by its gates; a delay circuit 72 whose input is connected to node N9 and whose output is connected to node N10; and a P-channel MOS transistor 66 connected between nodes N8 and N10 and receiving a control signal b[0] by its gate.

Replica buffer 36 further includes: an N-channel MOS transistor 68 connected between nodes N10 and N11 and for receiving control signal b[1] by its gate; a delay circuit 74 whose input is connected to node N11 and whose output is connected to node N12; and a P-channel MOS transistor 70 connected between nodes N10 and N12 and for receiving control signal b[1] by its gate.

In the first embodiment, replica buffer 36 is added to the conventional DLL circuit. If the rate of output data is desired to be increased only by 100 (ps), it is sufficient to increase a delay amount in replica buffer 36 only by 100 (ps).

FIG. 2 shows a configuration in which replica buffers 36 and 34 are sequentially connected, but the order of the sequence may be changed, specifically, in such a manner that clock signal CLKP is received by replica buffer 36, and replica buffer 34 receives an output of replica buffer 36 and outputs clock signal FBCLK.

Figure 3:
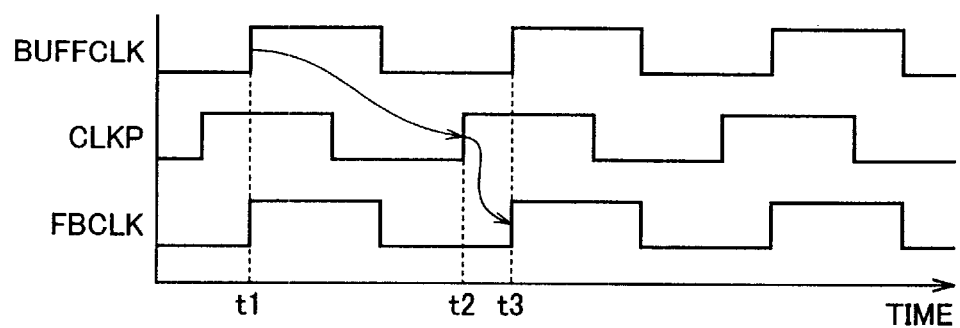
FIG. 3 is a first operational waveform chart for explaining the operation of the DLL circuit shown in FIG. 2.
Figure 4:
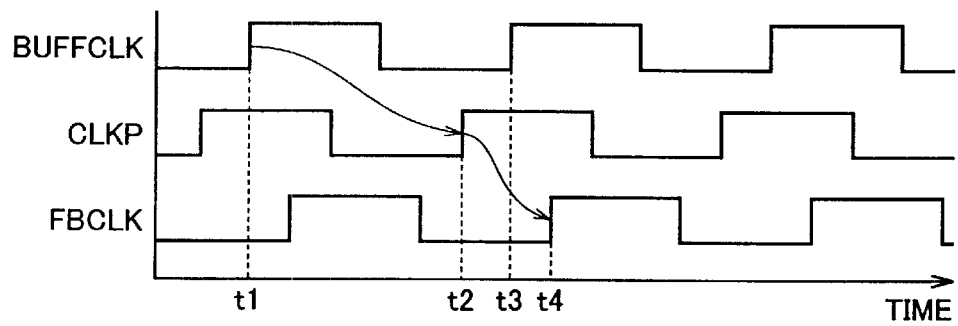
FIG. 4 is a second operational waveform chart for explaining the operation of the DLL circuit shown in FIG. 2.
Figure 5:
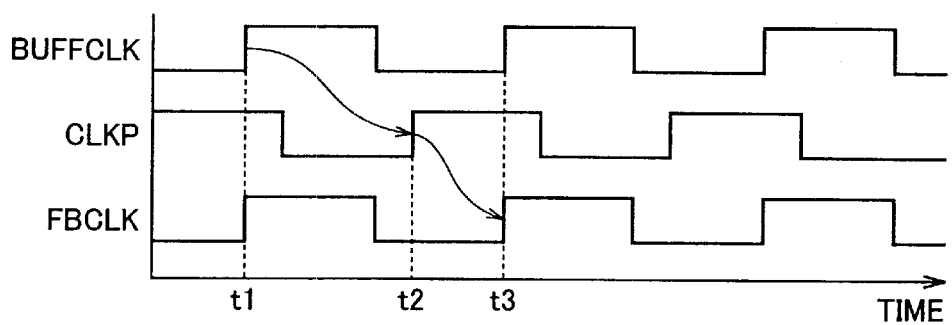
FIG. 5 is a third operational waveform chart for explaining the operation of the DLL circuit shown in FIG. 2.

FIGS. 3, 4, and 5 are operational waveform charts for explaining the operation of DLL circuit shown in FIG. 2.

Referring to FIGS. 2 and 3, for example, by setting that control signals b[1]=1 and b[0]=0 as an initial state, the phase at the rising edge of clock signal BUFFCLK and that of clock signal FBCLK are adjusted by DLL circuit in a conventional fashion.

In such a state, in replica buffer 36, N-channel MOS transistor 68 and P-channel MOS transistor 66 are made conducting, and P-channel MOS transistor 70 and N-channel MOS transistor 64 are made non-conducting. A signal supplied from replica buffer 34 to node N8 is transmitted to node N12 via P-channel MOS transistor 66, N-channel MOS transistor 68, and delay circuit 74.

That is, delay time indicated as a period between time t1 and t2 is determined by delay line 32, and delay time indicated as a period between time t2 and t3 is determined by replica buffers 34 and 36. Phase comparator 38 changes the delay time indicated by the period between time t1 and t2 by adjustment, thereby adjusting so that the rising edge of clock signal BUFFCLK and that of clock signal FBCLK coincide with each other at time t3.

It is now assumed that the phase of data output from this semiconductor memory device is behind that of another semiconductor memory device in a controller connected to external data bus as destination of clock signal CLKP.

Referring to FIGS. 2 and 4, control signals b supplied from the outside are set that b[1]=1 and b[0]=1. P-channel MOS transistor 66 is consequently made non-conducting and N-channel MOS transistor 64 is made conducting.

Signal is therefore transmitted in a path starting from node N8 to node N12 via N-channel MOS transistor 64, delay circuit 72, N-channel MOS transistor 68, and delay circuit 74.

Delay time from clock signal CLKP to clock signal FBCLK, namely, delay time in a period from t2 to t3 in replica buffer 36 therefore increases to time in a period from t2 to t4. Consequently, the phase at the rising edge of clock signal FBCLK becomes behind the phase at the rising edge of clock signal BUFFCLK.

Referring to FIGS. 2 and 5, phase comparator 38 adjusts the value of control signal a[2:0] so that the rising edge of clock signal BUFFCLK and that of clock signal FBCLK coincide with each other to shorten delay time of delay line 32. Accordingly, output timing of the rising edge of clock signal CLKP using clock signal BUFFCLK as a reference becomes earlier as compared with the case of FIG. 3.

By adjusting delay time in replica buffer 36 in such a manner, the phase of data arriving at the controller via the external data bus can be adjusted.

Figure 6:
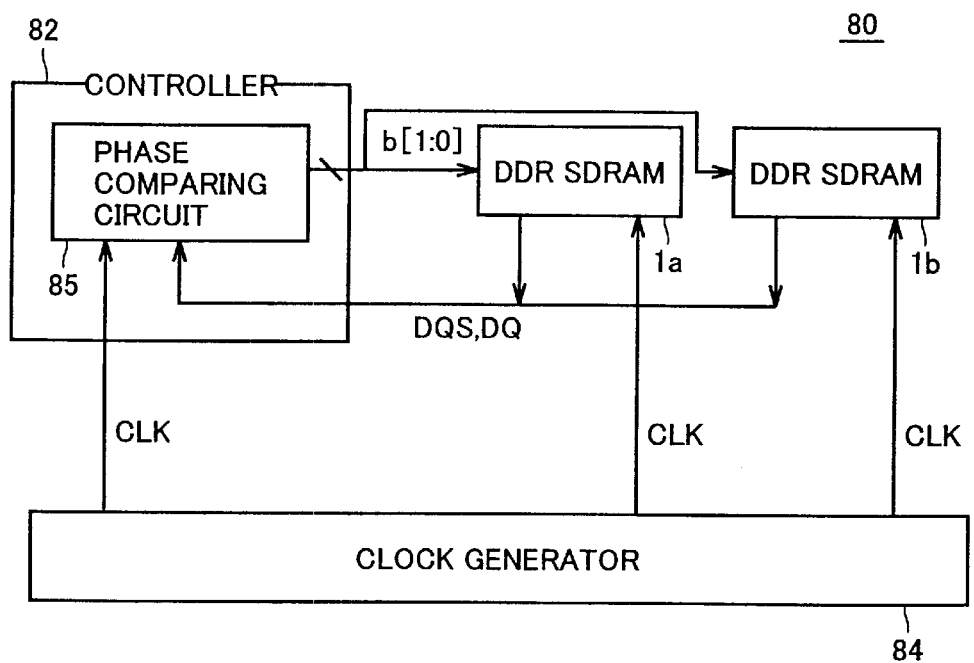
FIG. 6 is a block diagram for explaining a memory system 80 in which the semiconductor memory device 1 illustrated in FIG. 1 is used.

FIG. 6 is a block diagram for explaining a memory system 80 using the semiconductor memory device 1 illustrated in FIG. 1. A case of using a DDR SDRAM as semiconductor memory device 1 will be described hereinbelow as an example.

Referring to FIG. 6, memory system 80 includes: a clock generator 84 for generating an external clock signal CLK as a reference on the outside of the semiconductor memory device or the like; DDR SDRAMs 1a and 1b for outputting strobe signal DQS and data DQ to the external bus synchronously with clock signal CLK; and a controller 82 for receiving strobe signal DQS and data signal DQ from DDR SDRAMs 1a and 1b. Controller 82 operates synchronously with external clock signal CLK.

As each of DDR SDRAMs 1a and 1b, the semiconductor memory device 1 as shown in FIG. 1 is used.

To make the phases of data output signals DQ from DDR SDRAMs 1a and 1b coincide with each other, controller 82 includes a phase comparing circuit 85 for detecting a difference between the phase of data output signal DQ or data strobe signal DQS and the phase of clock signal CLK and feeding back the difference. Phase comparing circuit 85 supplies control signal b[1:0] according to the phase difference to each of DDR SDRAMs 1a and 1b in accordance with the phase difference detected.

FIG. 6 shows, as an example, the case of using clock signal CLK as a reference used by the phase comparing circuit 85 to compare phases. The clock signal received by DDR SDRAMs 1a and 1b and the signal as a reference to compare the phases do not always have to be a common clock signal, and the phases of signals may be different from each other.

To facilitate phase comparison, desirably, a mode of continuously outputting data signal DQ or strobe signal DQS is added to DDR SDRAMs 1a and 1b.

As shown in FIG. 2, DDR SDRAMs 1a and 1b have the function of adjusting output phases of data signal DQ and strobe signal DQS in accordance with control signal b[1:0].

Consequently, by repeating a sequence of phase comparison in controller 82, feedback of detected phase information, and phase adjustment of output data, controller can adjust the phase of output data from DDR SDRAM 1a and that from DDR SDRAM 1b to be the same as the phase of a reference.

By performing adjustment in such a manner, in the case where there are a plurality of DDR SDRAMs, controller can capture output data with a single reference phase from the plurality of DDR SDRAMs. Consequently, unlike the conventional technique, it becomes unnecessary to perform a complicated process of capturing data in response to DQS of which phase varies according to chips. Thus, the circuit configuration of controller 82 can be simplified.

Figure 7:
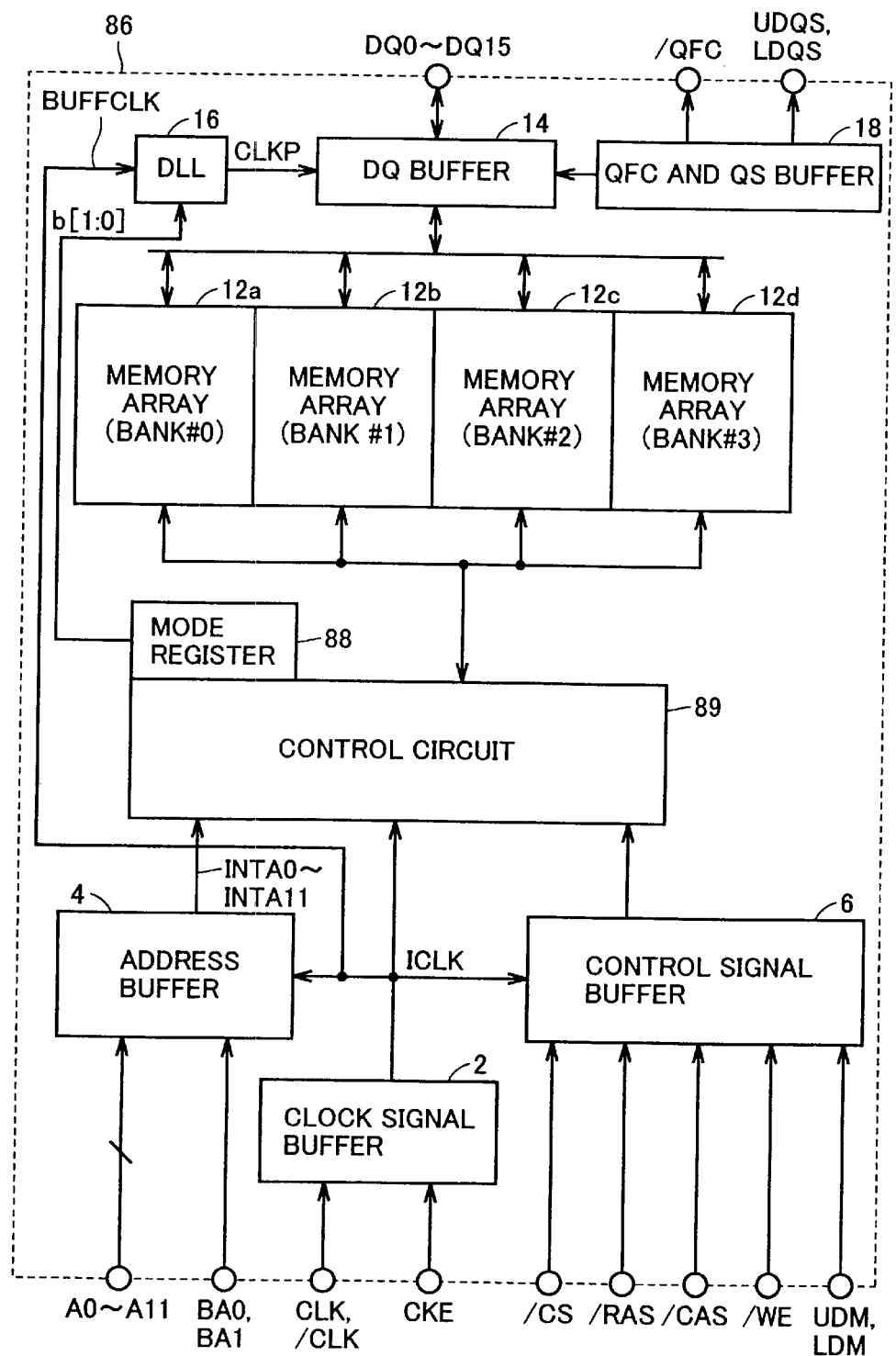
FIG. 7 is a block diagram of a semiconductor memory device 86 for explaining a modification of a first embodiment.

FIG. 7 is a block diagram of a semiconductor memory device 86 for explaining a modification of the first embodiment.

Referring to FIG. 7, semiconductor memory device 86 includes a mode register 88 to which the function of outputting control signal b[1:0] is added in place of mode register 10 in the configuration of semiconductor memory device 1 shown in FIG. 1, and includes a control circuit 89 in place of control circuit 8. The configuration of semiconductor memory device 86 is different from that of semiconductor memory device 1 with respect to the point that DLL circuit 16 receives control signal b[1:0] from mode register 88. Since the other configuration is similar to that of semiconductor memory device 1, its description will not be repeated.

Figure 8:
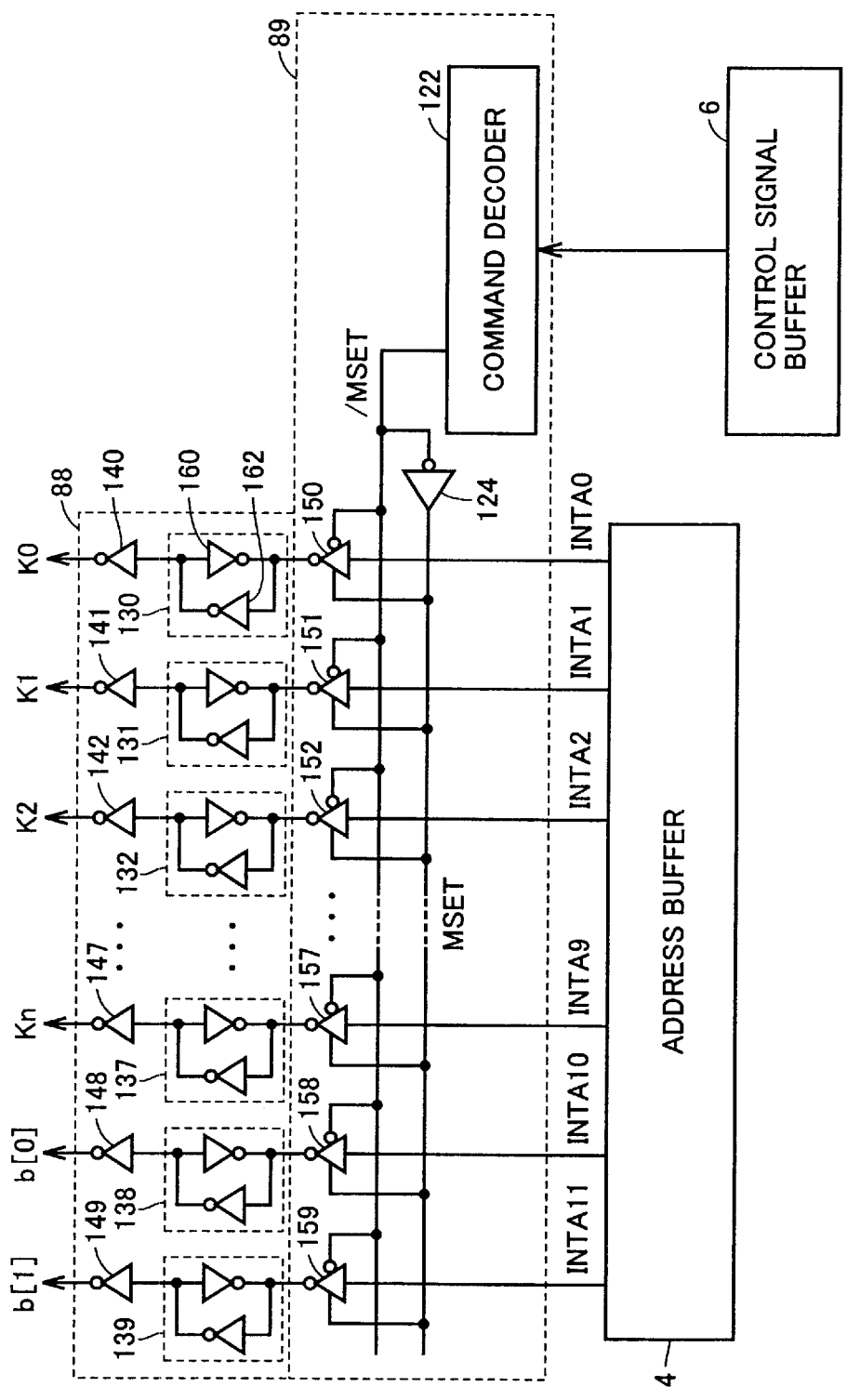
FIG. 8 is a circuit diagram showing a part of the configuration of a mode register 88 and a control circuit 89 in FIG. 7.

FIG. 8 is a circuit diagram showing a part of the configuration of mode register 88 and control circuit 89 in FIG. 7.

Referring to FIG. 8, control circuit 89 includes: a command decoder 122 for receiving and decoding an output of control signal buffer 6, detecting a mode register set command, and activating control signal /MSET to the L level; an output inverter 124 for receiving and inverting control signal /MSET and outputting control signal MSET; and clocked inverters 150, 151, and 152 for inverting internal address signals INTA0, INTA1, and INTA2, respectively, output from the address buffer 4 in accordance with control signals MSET and /MSET and outputting resultant signals.

Control circuit 89 further includes clocked inverters 157, 158, and 159 which are activated according to control signals MSET and /MSET to receive and invert internal address signals INTA9, INTA10, and INTA11 output from address buffer 4, respectively.

Mode register 88 includes latch circuits 130, 131, and 132 for latching outputs of clocked inverters 150, 151, and 152, respectively, and inverters 140, 141, and 142 for receiving and inverting outputs of latch circuits 130, 131, and 132 and outputting resultant signals K0, K1, and K2, respectively.

Mode register 88 further includes latch circuits 137, 138, and 139 for latching outputs of clocked inverters 157, 158, and 159, and inverters 147, 148, and 149 for receiving and inverting outputs of latch circuits 137, 138, and 139 and outputting resultant signals Kn, b[0], and b[1], respectively.

Latch circuit 130 includes an inverter 162 for receiving and inverting a signal supplied to its input, and an inverter 160 for feeding back an output of inverter 162 to the input of inverter 162. Each of latch circuits 131 to 139 has a configuration similar to that of latch circuit 130 and its description will not be repeated.

Mode register is, generally, a register provided for each DDR SDRAM and is used by a controller to program output latency and burst length in the DDR SDRAM. When bits which are not assigned at present exist in mode register, the bits are newly defined as bits for replica adjustment and a control signal b[1:0] is output on the basis of the bits. In such a manner, feedback of phase difference information from controller to each chip can be easily realized. Obviously, when bits are not sufficient in the current configuration, it is sufficient to newly add bits of mode register.

Second Embodiment

In a second embodiment, in a manner similar to the first embodiment, burden on the controller is lessened by setting the phases of output data of a plurality of memories having different flight times to the same phase. The invention will be described similarly by a system using a DDR SDRAM.

Figure 9:
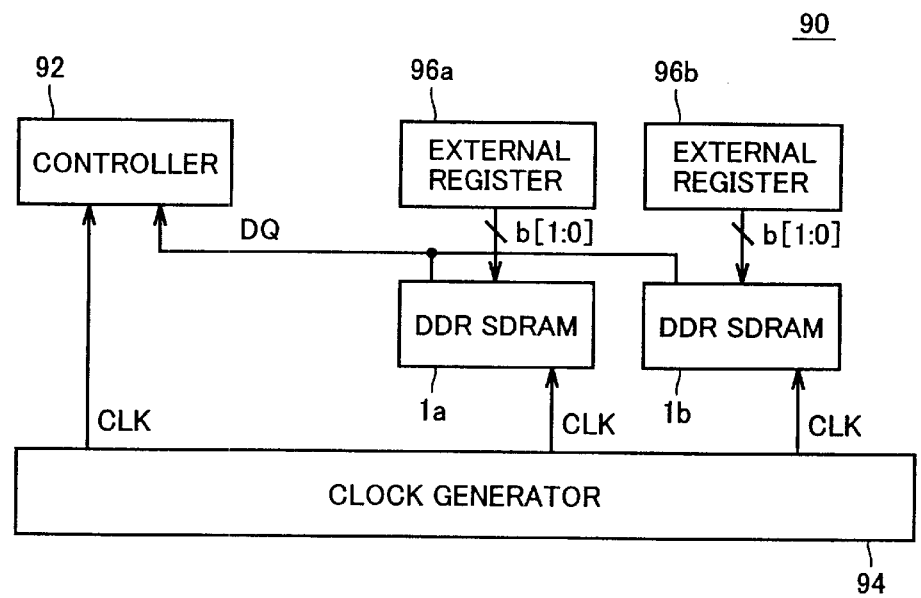
FIG. 9 is a schematic block diagram showing the configuration of a memory system 90 according to a second embodiment.

FIG. 9 is a schematic block diagram showing the configuration of a memory system 90 according to the second embodiment.

Referring to FIG. 9, memory system 90 includes: a clock generator 94 for outputting clock signal CLK; DDR SDRAMs 1a and 1b for outputting data signal DQ to the external data bus synchronously with clock signal CLK; and controller 92 which operates synchronously with clock signal CLK and receives data signal DQ from DDR SDRAMs 1a and 1b. As described in the first embodiment, DDR SDRAMs 1a and 1b can adjust the phase of output data signal DQ in accordance with control signal b[1:0].

Memory system 90 further includes external registers 96a and 96b for holding phase difference information corresponding to control signal b[1:0], in which phase difference of each of DDR SDRAMs 1a and 1b is reflected. Phase difference information is pre-written in the external registers 96a and 96b.

The phase difference information may be measured and written when memory system 90 is assembled on a printed board. Alternatively, the value of phase difference information may be fixed at the time point when, in memory system 90, the layout of controller 92 and DDR SDRAMs 1a and 1b as well as a wiring pattern of a data bus carrying the data signal DQ are determined.

With such a configuration, controller 92 can capture output data of DDR SDRAM with a single reference phase. An effect such that it becomes unnecessary to capture data in response to strobe signal DQS of which phase differs according to the DDR SDRAMs in a conventional manner is produced.

The difference between the phase of output data and that of a reference may be measured by providing a circuit on the inside of a controller as described in the first embodiment. Since the phase difference can be preliminarily measured by an external measuring device or the like, it is not always necessary to provide the controller with the phase comparing function.

Third Embodiment

Figure 10:
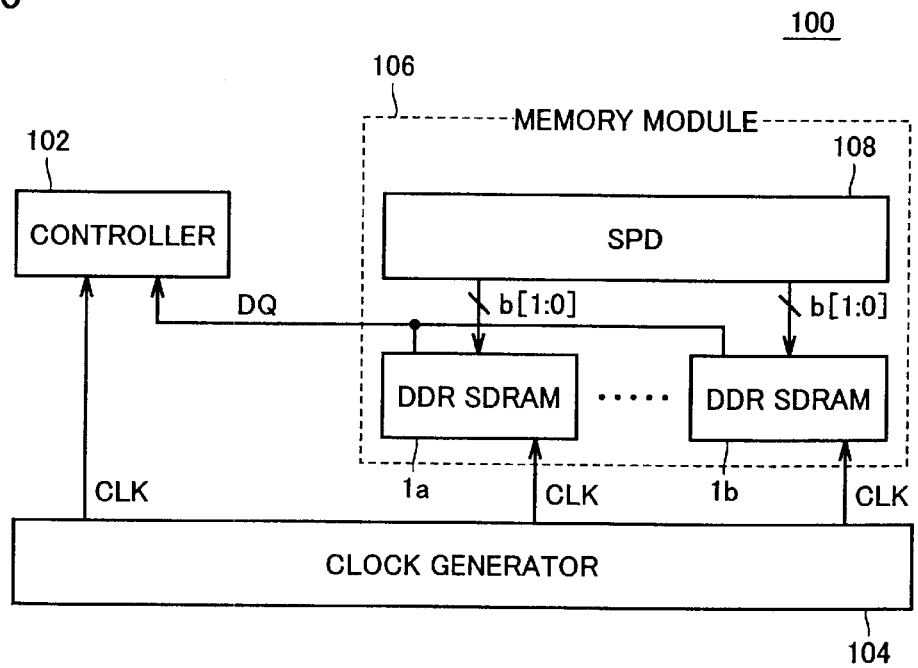
FIG. 10 is a schematic block diagram showing the configuration of a memory system 100 according to a third embodiment.

FIG. 10 is a schematic block diagram showing the configuration of a memory system 100 according to a third embodiment.

Referring to FIG. 10, the memory system 100 includes: a clock generator 104 for outputting clock signal; a memory module 106 for outputting output data signal DQ to a data bus synchronously with clock signal CLK; and a controller 102 for capturing data signal DQ output to the data bus from memory module 106 synchronously with clock signal CLK.

Memory module 106 includes DDR SDRAMs 1a and 1b for outputting data signal DQ to data bus in accordance with clock signal CLK and control signal b[1:0], and an SPD 108 for outputting individual control signals b[1:0] according to flight times of DDR SDRAMs 1a and 1b.

SPD denotes "Serial Presence Detect" and is a standard used for communications of recognition information of a memory module or the like by serial transmission. For example, on the memory module used as a main memory of a personal computer, usually, an EEPROM (Electrically Erasable Programmable ROM) is mounted in which information adapted to the SPD standard is pre-stored. SPD 108 is a kind of external registers and corresponds to, for example, an EEPROM in which recognition information of the memory module is stored.

By the recognition information sent from SPD 108, a microprocessor in a personal computer automatically sets the kind and configuration of a semiconductor memory device, capacity, kind and the presence or absence of an error check, access timing, and the like.

In the case of a system constructed by a module and controller, in place of the external register in the second embodiment, SPD 108 can be used as shown in FIG. 10. Consequently, there is an advantage that the trouble of preparing an external register is eliminated.

To be specific, in addition to SPD 108 in which recognition information is stored, the control signal b[1:0] according to flight time of each of DDR SDRAMs 1a and 1b is stored. Each of DDR SDRAMs 1a and 1b determines a timing of outputting data in accordance with the dedicated control signal b[1:0].

In a manner similar to the second embodiment, the controller can capture output data of the memory with the single reference phase. Consequently, the process of capturing data in response to strobe signal DQS of which phase varies according to the chips as in the conventional manner does not have to be performed.

Fourth Embodiment

Figure 11:
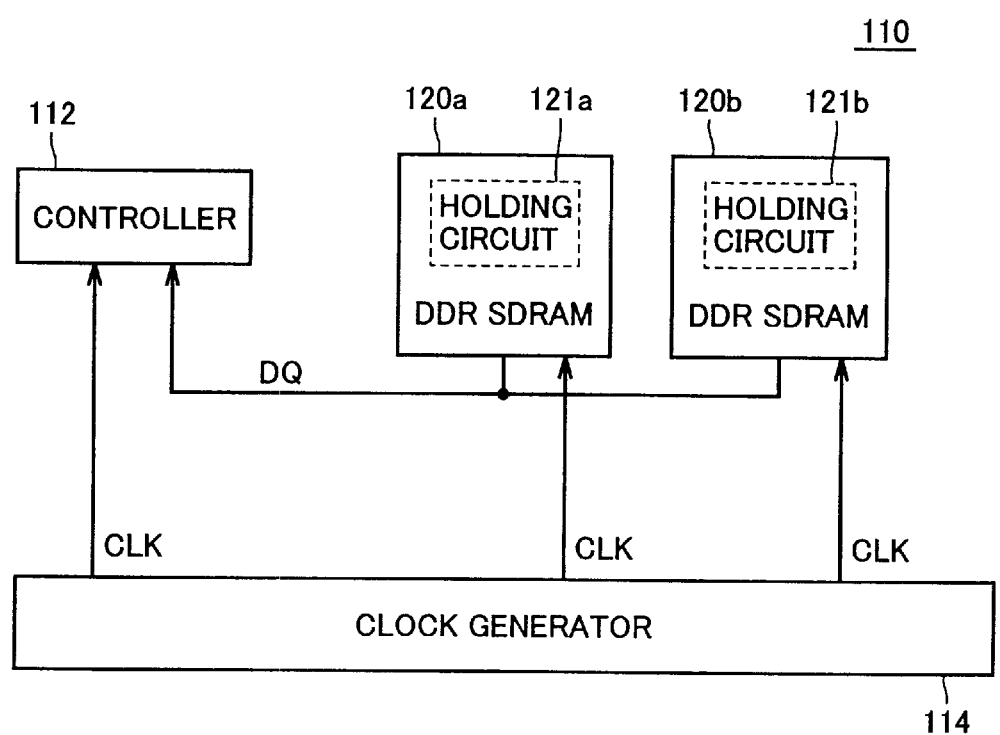
FIG. 11 is a block diagram showing the configuration of a memory system 110 according to a fourth embodiment.

FIG. 11 is a block diagram showing the configuration of a memory system 110 of a fourth embodiment.

Referring to FIG. 11, memory system 110 includes a clock generator 114 for outputting clock signal CLK, DDR SDRAMs 120a and 120b for outputting data signal DQ synchronously with clock signal CLK, and a controller 112 which operates synchronously with clock signal CLK and receives data signal DQ.

DDR SDRAMs 120a and 120b include holding circuits 121a and 121b for holding phase difference information in a non-volatile fashion. In a manner similar to the first embodiment, by providing a phase comparator in controller 112, the phase difference between clock signal CLK giving a reference phase and data signal DQ is measured and phase difference information according to the result of measurement may be written in holding circuits 121a and 121b. It is also possible to preliminarily measure the phase difference by an external measuring device or the like and write the measured phase difference in holding circuits 121a and 121b. In the case of preliminarily measuring the phase difference by the external measuring device or the like, it is not always necessary to assemble the phase comparator in the controller.

In a manner similar to the case described in the first embodiment, DDR SDRAMs 120a and 120b can change the phase of output data signal DQ in accordance with values written in the holding circuits 121a and 121b, respectively.

Figure 12:
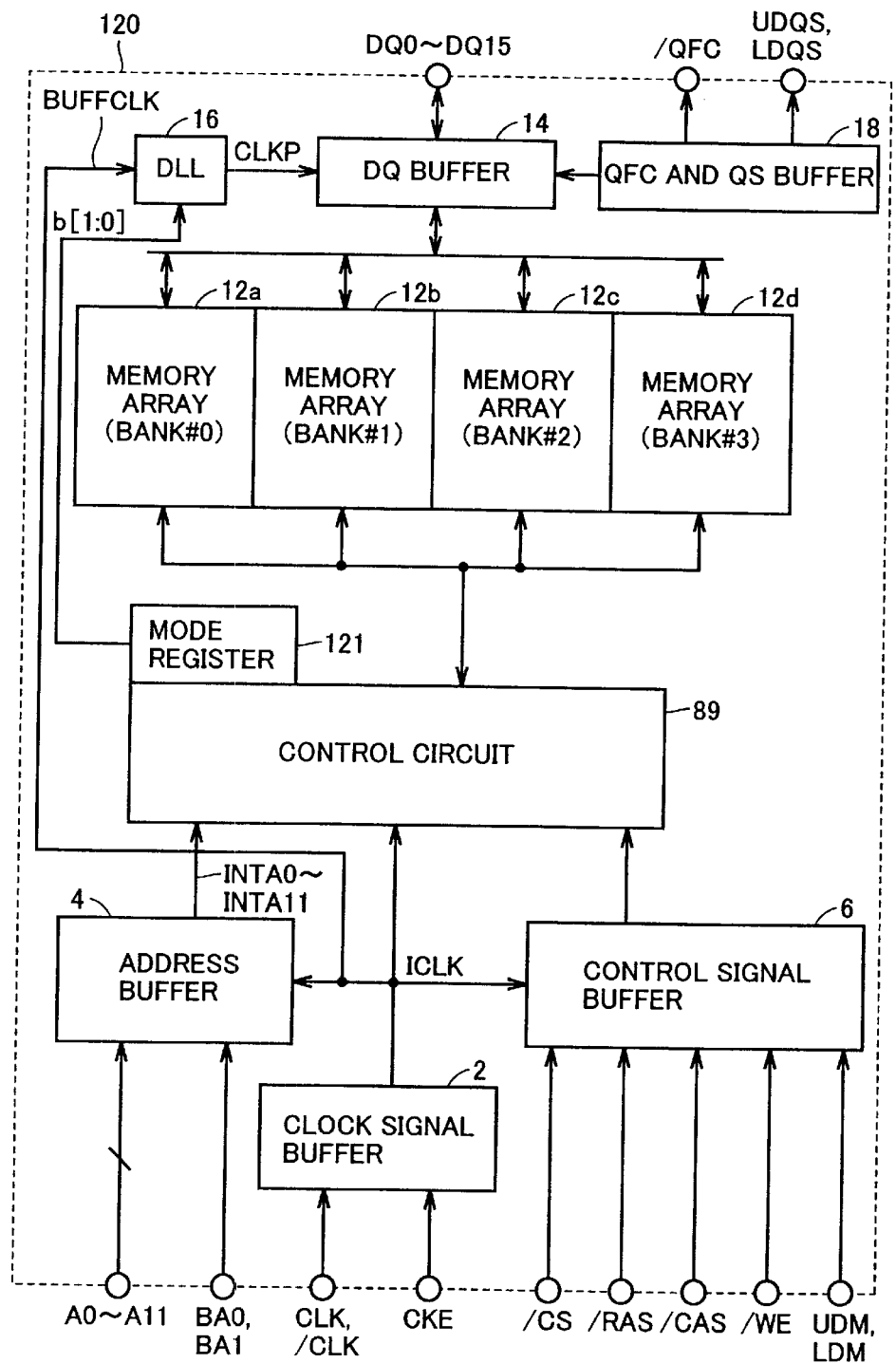
FIG. 12 is a block diagram showing the configuration of a semiconductor memory device 120 as one of concrete examples of DDR SDRAMs 120a and 120b illustrated in FIG. 11.

FIG. 12 is a block diagram showing the configuration of a semiconductor memory device 120 as one of concrete examples of DDR SDRAMs 120a and 120b illustrated in FIG. 11.

Referring to FIG. 12, semiconductor memory device 120 has a mode register 121 in place of mode register 88 in the configuration of semiconductor memory device 86 illustrated in FIG. 7. The other configuration is similar to that of semiconductor memory device 86 illustrated in FIG. 7 and its description will not be repeated.

Figure 13:
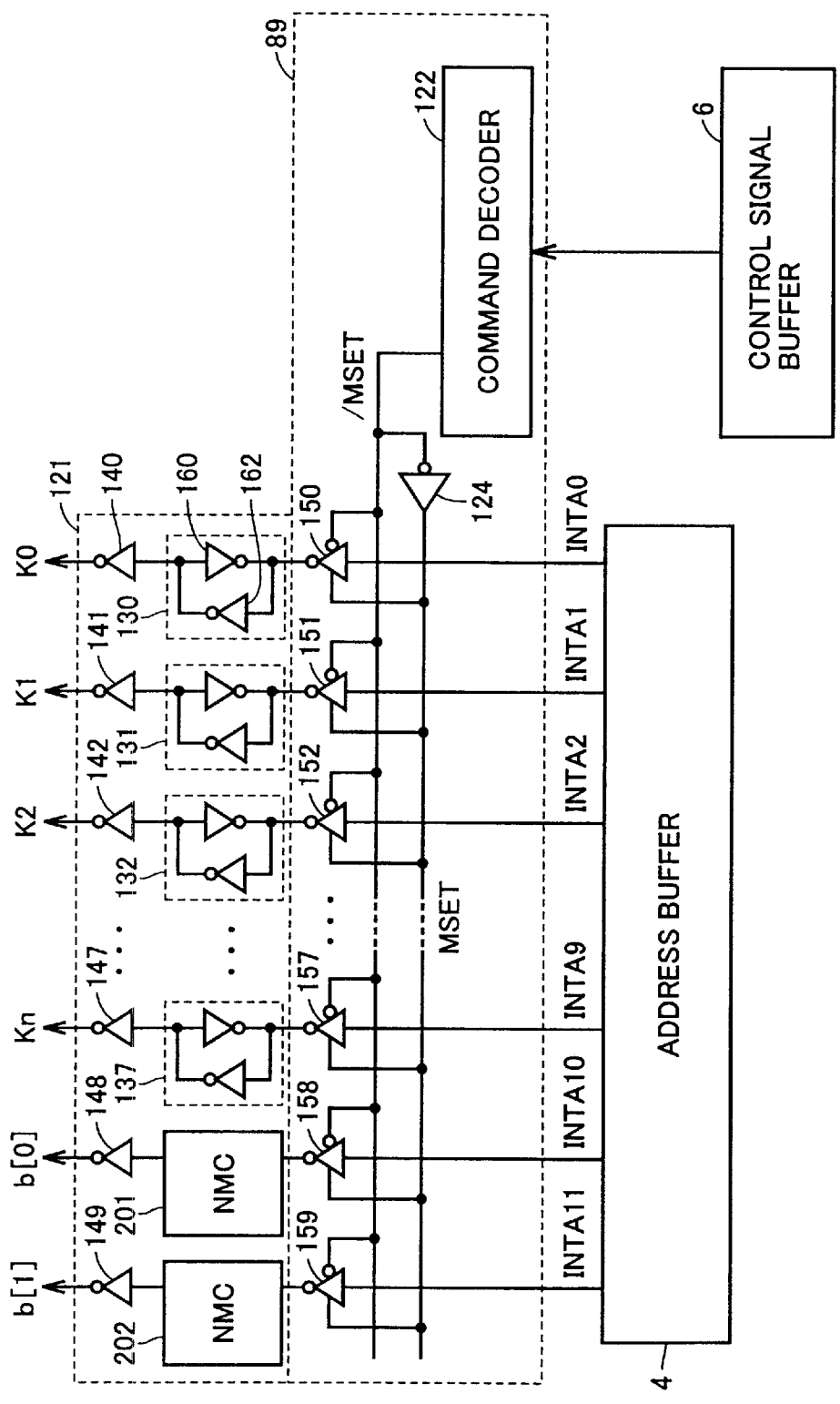
FIG. 13 is a circuit diagram showing the configuration of a mode register 121 in FIG. 12.
Figure 14:
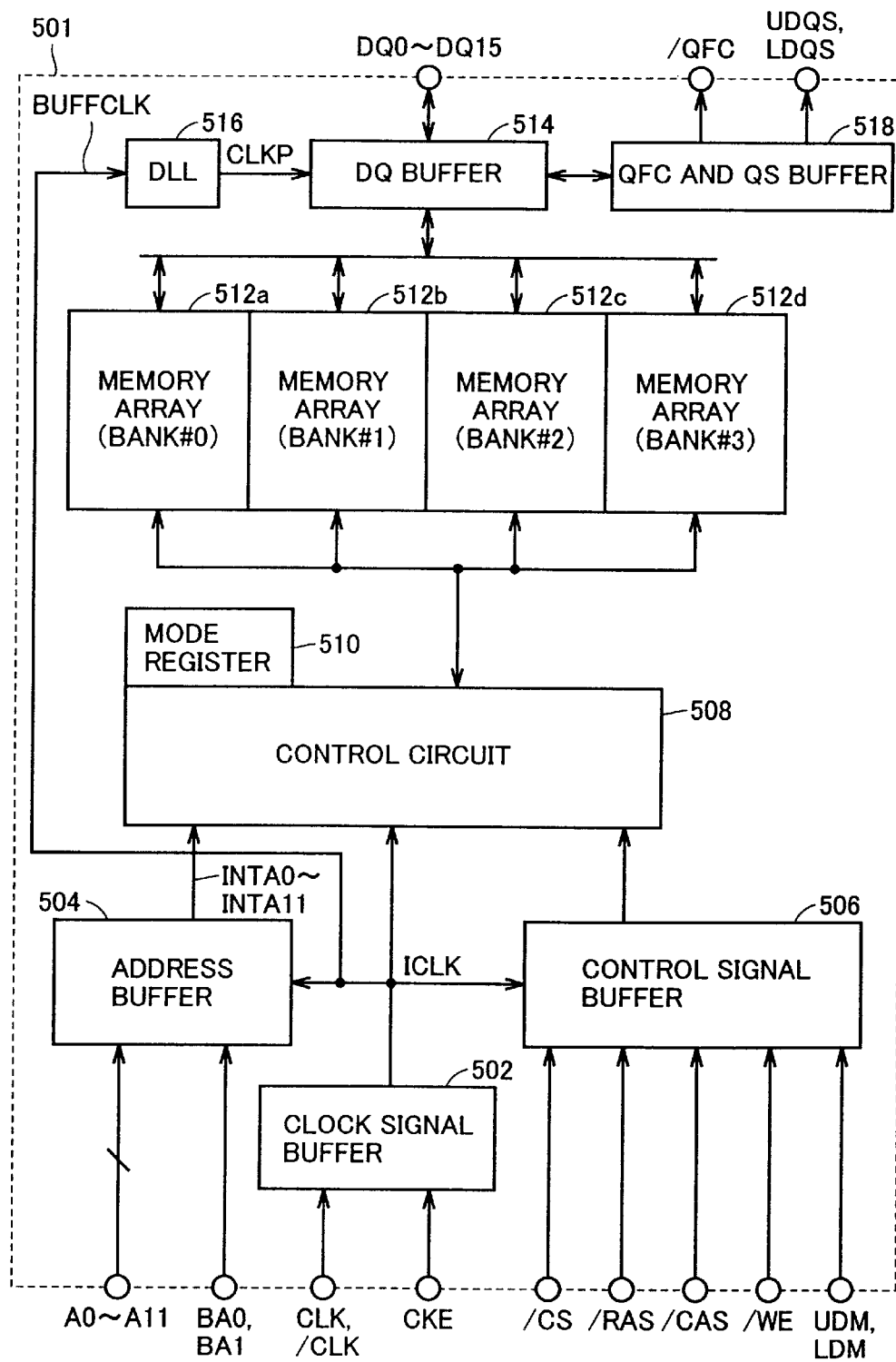
FIG. 14 is a block diagram showing the configuration of a conventional DDR SDRAM 501.
Figure 15:
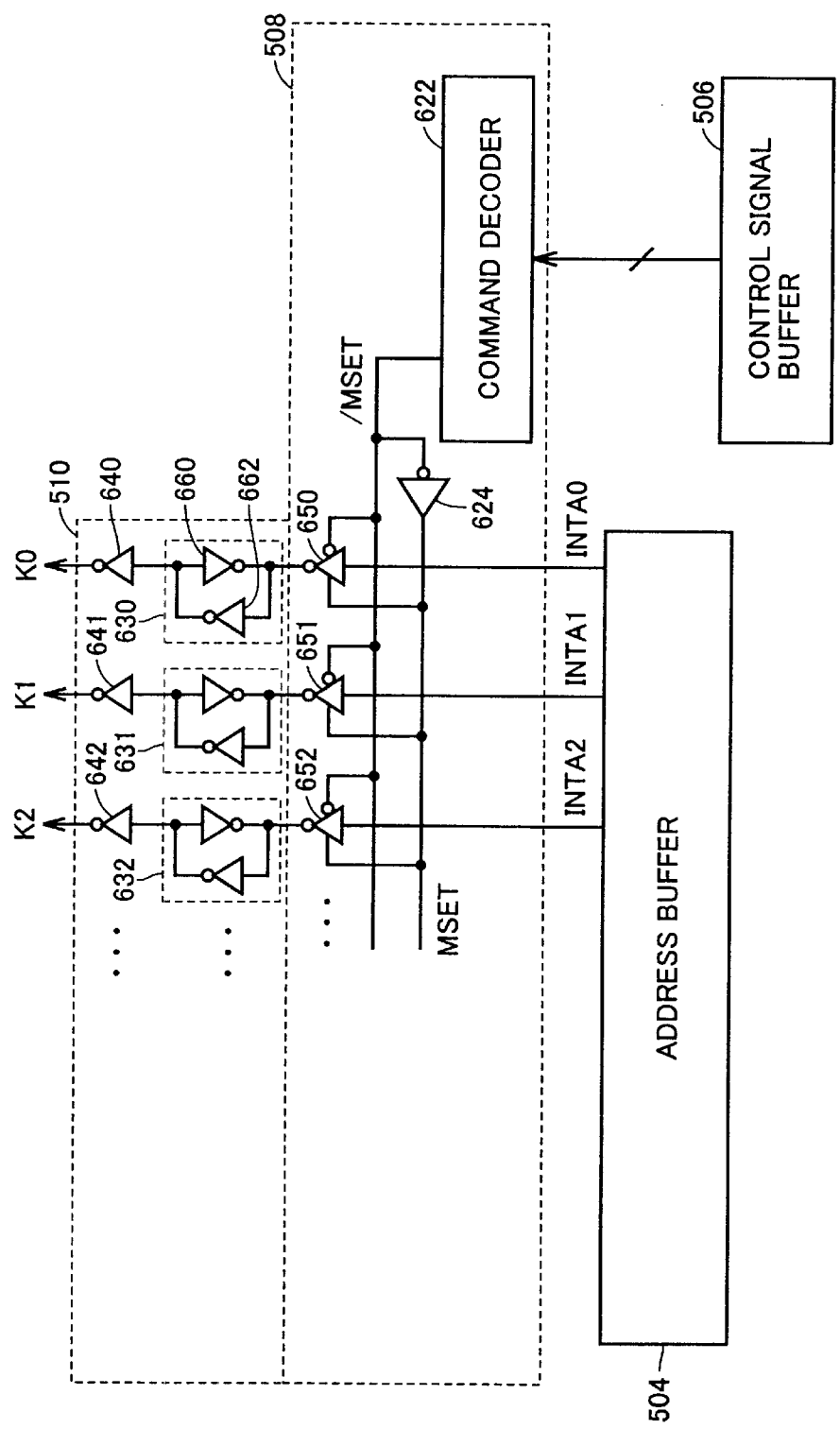
FIG. 15 is a diagram for explaining the configuration of a mode register 510 and a control circuit 508 in FIG. 14.
Figure 16:
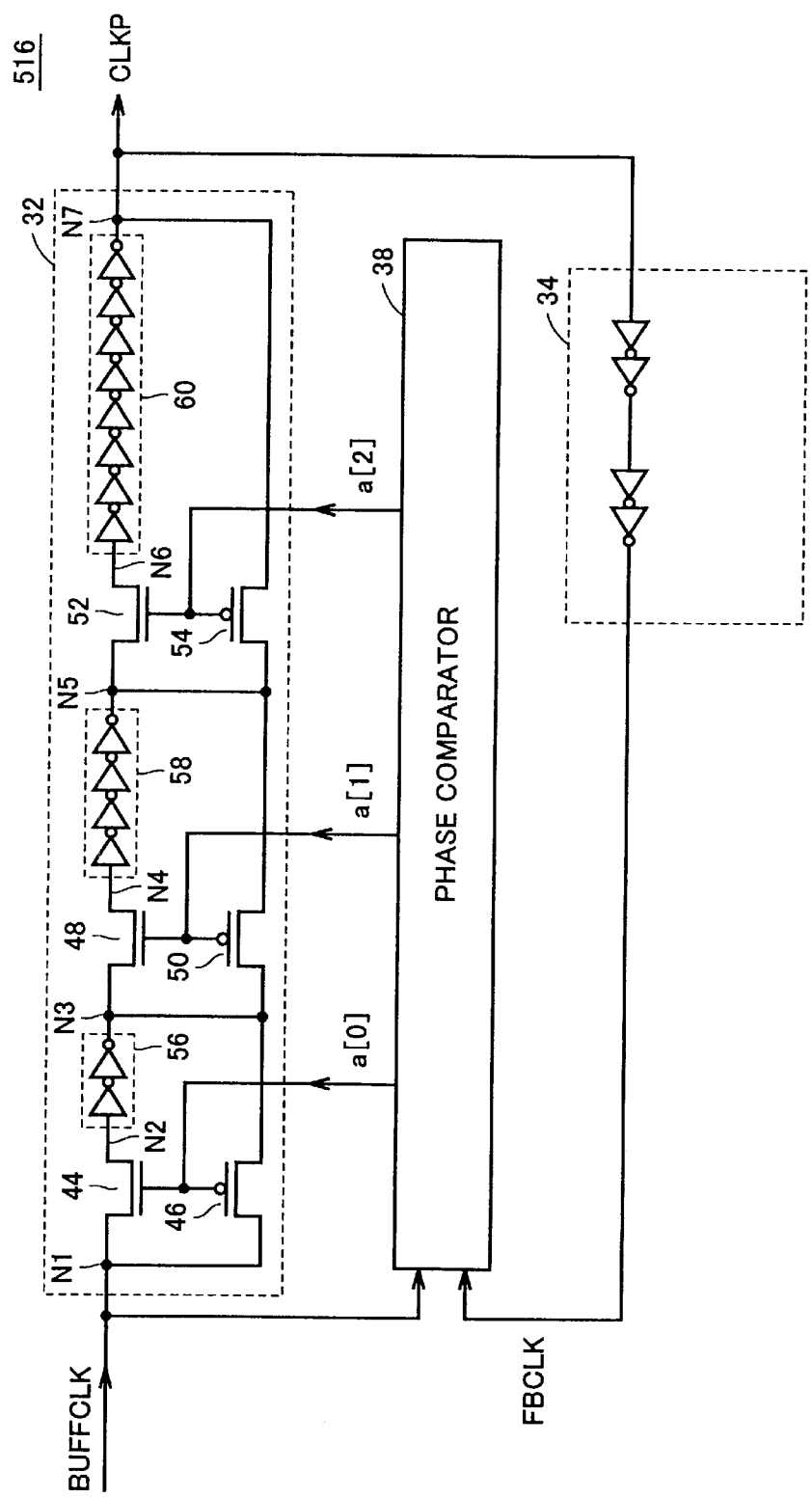
FIG. 16 is a circuit diagram showing the configuration of a DLL circuit 516 in FIG. 14.
Figure 17:
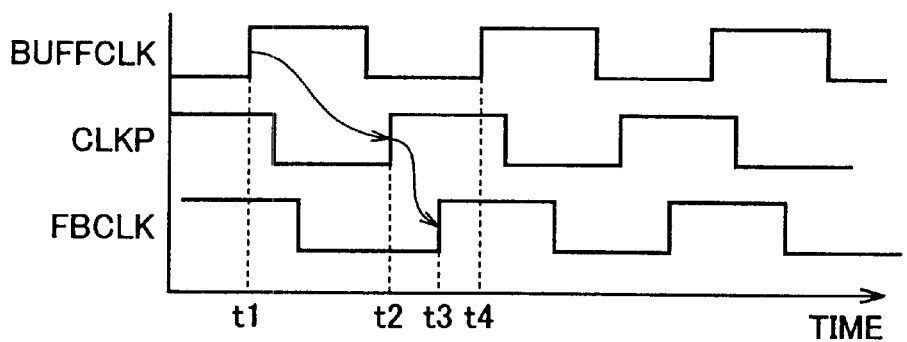
FIG. 17 is a first operational waveform chart for explaining the operation of DLL circuit 516 shown in FIG. 16.
Figure 18:
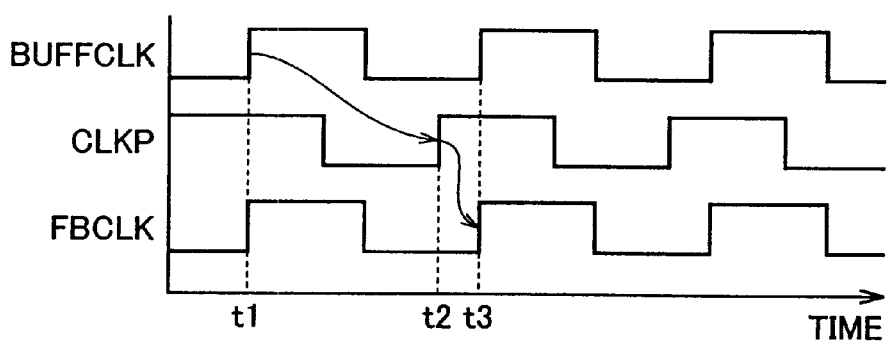
FIG. 18 is a second operational waveform chart for explaining the operation of DLL circuit 516 shown in FIG. 16.
Figure 19:
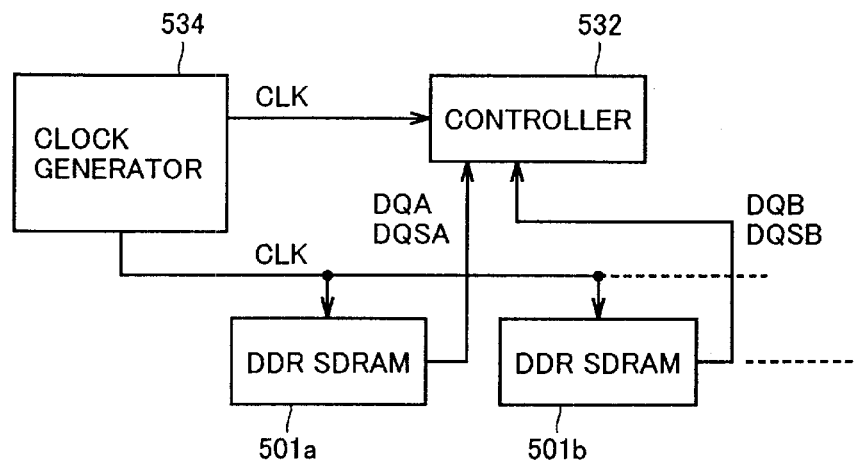
FIG. 19 is a diagram showing a schematic configuration of a system using a conventional DDR SDRAM.
Figure 20:
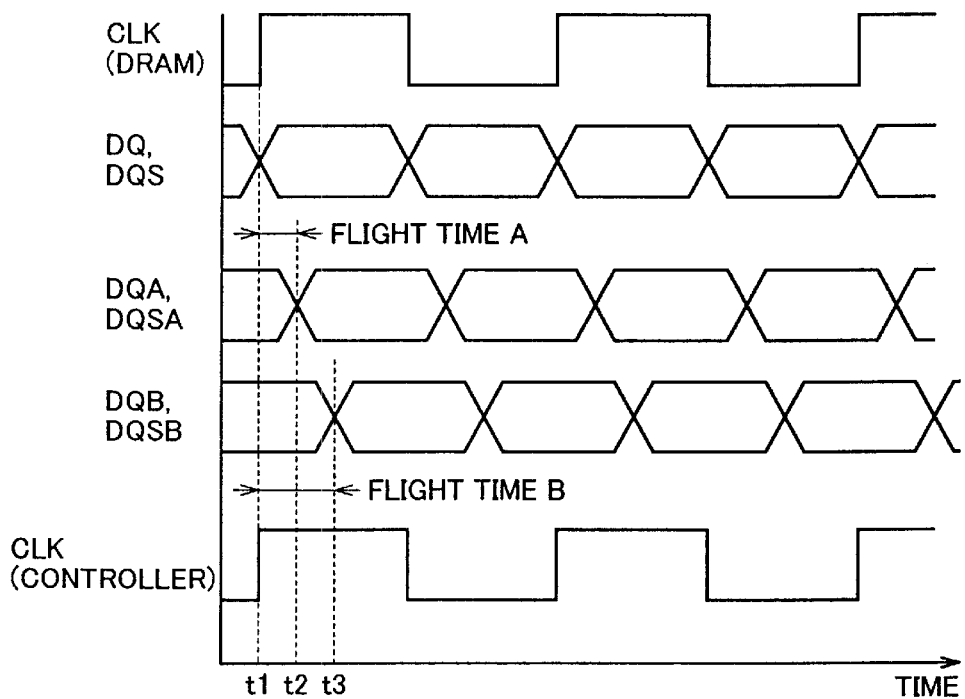
FIG. 20 is an operational waveform chart for explaining data transmission/reception of the memory system shown in FIG. 19.

FIG. 13 is a circuit diagram showing the configuration of mode register 121 in FIG. 12.

Referring to FIG. 13, mode register 121 has nonvolatile memory cells 201 and 202 in place of latch circuits 138 and 139, respectively, in the configuration of mode register 88 illustrated in FIG. 8. The other configuration is similar to that of mode register 88 and its description will not be repeated. Specifically, when bits in a part of mode register are replaced by a nonvolatile memory such as a flash memory and defined as bits for replica adjustment, rewriting can be performed by a sequence similar to that of writing in a normal mode register.

By preliminarily measuring delay time between each semiconductor memory device and a controller and writing a value corresponding to a control signal according to the delay time in the bits of the mode register, it becomes unnecessary to provide a phase comparator in the controller as described in the first embodiment.

Obviously, as described in the first embodiment, the phase comparator may be provided in the controller, and the controller can rewrite the mode register. In this case, since an adjustment value is written in nonvolatile memory cells 201 and 202, by performing adjustment once and writing the adjustment value, the adjustment is unnecessary in principle at the next power-on. It is sufficient to carry out phase adjustment only when the phases are consciously different from each other from the next time on, so that the adjustment time can be shortened.

As stated above, since the controller can capture output data of a semiconductor memory device with a single reference phase, the process of capturing data in response to strobe signal DQS of which phase differs according to chips as in a conventional manner is unnecessary. By using a nonvolatile memory prepared in the semiconductor memory device, there is also an advantage that the trouble of preparing an external register is eliminated as in the second embodiment.

Although the foregoing first to fourth embodiments have been described with respect to the system using DDR SDRAM, the invention is not limited to the system using DDR SDRAM but can be applied to systems using every memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for outputting data synchronously with an external clock signal, comprising:

an internal clock generating circuit for outputting a first internal clock signal synchronously with said external clock signal, said internal clock generating circuit adjusting a phase difference between said external clock signal and said first internal clock signal in accordance with a phase adjustment value provided by an external source external to the semiconductor memory device;

a memory array including a plurality of memory cells for holding said data; and an output buffer circuit for outputting data read from said memory array synchronously with said first internal clock signal.

2. The semiconductor memory device according to claim 1, further comprising a mode register for holding operation mode data corresponding to an operational mode of said semiconductor memory device in accordance with a command supplied by the external source, wherein said mode register includes
a first holding unit for holding said operation mode data, and
a second holding unit for holding said phase adjustment value; and
said internal clock generating circuit adjusts said phase difference in accordance with an output of said second holding unit.

3. The semiconductor memory device according to claim 2, wherein said first and second holding units have volatile first and second data holding circuits, respectively.

4. The semiconductor memory device according to claim 2, wherein said first holding unit has a volatile first data holding circuit, and
said second holding unit has a nonvolatile second data holding circuit.

5. The semiconductor memory device according to claim 1, wherein said internal clock generating circuit includes a first delay circuit for delaying said first internal clock signal in accordance with said phase adjustment value and outputting a second internal clock signal,
a phase comparing circuit for detecting a phase difference between said external clock signal and said second internal clock signal; and
a clock output unit for outputting said first internal clock signal in accordance with an output of said phase comparing circuit.

6. The semiconductor memory device according to claim 5, wherein said clock output unit has a second delay circuit for delaying said external clock signal in accordance with an output of said phase comparing circuit and outputting said first internal clock signal.

7. The semiconductor memory device according to claim 5, wherein said first delay circuit has first and second delay units connected in series on a path for transmitting a signal from a first node for receiving said first internal clock signal to a second node for outputting said second internal clock signal, said first delay unit delays a signal only by a first delay time corresponding to delay time since said output buffer receives said first internal clock until said output buffer outputs data, and
said second delay unit delays a signal only by second delay time according to said phase adjustment value.

8. A memory system comprising:
a clock generating circuit for generating a system clock signal;
a controller for receiving a data signal synchronously with said system clock signal; and
a plurality of semiconductor memory devices for outputting said data signal to said controller in accordance with said system clock signal, each of said plurality of semiconductor memory devices including an internal clock generating circuit for outputting a first internal clock signal synchronously with said system clock signal, said internal clock generating circuit adjusting a phase difference between said system clock signal and said first internal clock signal in accordance with a phase adjustment value provided by an external source, and each of said plurality of semiconductor memory devices further including
a memory array including a plurality of memory cells for holding said data, and
an output buffer circuit for outputting, as said data signal, said data read from said memory array synchronously with said first internal clock signal.

9. The memory system according to claim 8, wherein
each of said plurality of semiconductor memory devices further includes a mode register for holding operational mode data corresponding to an operational mode of said semiconductor memory device in accordance with an externally supplied command, said mode register includes
a first holding unit for holding said operational mode data; and
a second holding unit for holding said phase adjustment value, and
said internal clock generating circuit adjusts said phase difference in accordance with an output of said second holding unit.

10. The memory system according to claim 9, wherein said first and second holding units have volatile first and second data holding circuits, respectively.

11. The memory system according to claim 9, wherein
said first holding unit has a volatile first data holding circuit, and
said second holding unit has a nonvolatile second data holding circuit.

12. The memory system according to claim 8, wherein
said internal clock generating circuit includes
a first delay circuit for delaying said first internal clock signal in accordance with said phase adjustment value and outputting a second internal clock signal,
a phase comparing circuit for detecting a phase difference between said system clock signal and said second internal clock signal, and
a clock output unit for outputting said first internal clock signal in accordance with an output of said phase comparing circuit.

13. The memory system according to claim 12, wherein said clock output unit has a second delay circuit for delaying said system clock signal in accordance with an output of said phase comparing circuit and outputting said first internal clock signal.

14. The memory system according to claim 12, wherein
said first delay circuit has first and second delay units connected in series on a path for transmitting a signal from a first node for receiving said first internal clock signal to a second node for outputting said second internal clock signal, said first delay unit delays a signal only by a first delay time corresponding to delay time since said output buffer receives said first internal clock until said output buffer outputs data, and said second delay unit delays a signal only by a second delay time according to said phase adjustment value.

15. The memory system according to claim 8, wherein said controller includes a phase comparing circuit for comparing a phase of said data signal with a phase of a predetermined reference signal and supplying said phase adjustment value to each of said plurality of semiconductor memory devices so that the phases of said data signals output from said plurality of semiconductor memory devices at a time point when said data signals are input to said controller are the same.

16. The memory system according to claim 8, further comprising a holding circuit for holding said phase adjustment value corresponding to each of said plurality of semiconductor memory devices, and wherein said internal clock generating circuit receives corresponding said phase adjustment value from said holding circuit and adjusts said phase difference.

17. The memory system according to claim 16, wherein said holding circuit is mounted on a memory module on which said plurality of semiconductor memory devices are mounted and further holds recognition information of said memory module adapted to an SPD standard.

18. A memory module comprising a plurality of semiconductor memory devices for outputting a data signal synchronously with a system clock signal, each of said plurality of semiconductor memory devices including an internal clock generating circuit for outputting a first internal clock signal synchronously with said system clock signal, said internal clock generating circuit for adjusting a phase difference between said system clock signal and said first internal clock signal in accordance with a phase adjustment value supplied by an external source, and each of said plurality of semiconductor memory devices further including a memory array including a plurality of memory cells for holding data, and an output buffer circuit for outputting, as said data signal, said data read from said memory array synchronously with said first internal clock signal.

19. The memory module according to claim 18, further comprising a holding circuit for holding said phase adjustment value corresponding to each of said plurality of semiconductor memory devices, wherein said internal clock generating circuit receives corresponding said phase adjustment value from said holding circuit and adjusts said phase difference.

20. The memory module according to claim 19, wherein said holding circuit further holds recognition information of said memory module adapted to an SPD standard.

* * * * *